(12) United States Patent
Yamaoka et al.

(10) Patent No.: US 11,025,211 B2
(45) Date of Patent: Jun. 1, 2021

(54) AMPLIFICATION APPARATUS AND TRANSMISSION APPARATUS

(71) Applicants: Kabushiki Kaisha Toshiba, Minato-ku (JP); Toshiba Infrastructure Systems & Solutions Corporation, Kawasaki (JP)

(72) Inventors: Atsushi Yamaoka, Yokohama (JP); Keiichi Yamaguchi, Kawasaki (JP); Yuuki Funahashi, Fuchu (JP)

(73) Assignees: Kabushiki Kaisha Toshiba, Minato-ku (JP); Toshiba Infrastructure Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 16/562,835

(22) Filed: Sep. 6, 2019

(65) Prior Publication Data
US 2020/0295719 A1  Sep. 17, 2020

(30) Foreign Application Priority Data

Mar. 14, 2019 (JP) .............. JP2019-047404

(51) Int. Cl.
*H03F 1/30* (2006.01)
*H03F 3/24* (2006.01)
*H03F 1/32* (2006.01)
*H04B 1/04* (2006.01)

(52) U.S. Cl.
CPC ........... *H03F 3/245* (2013.01); *H03F 1/3205* (2013.01); *H03F 2200/33* (2013.01); *H03F 2200/351* (2013.01); *H03F 2200/451* (2013.01); *H03F 2203/21106* (2013.01); *H03F 2203/21142* (2013.01); *H03F 2203/21157* (2013.01); *H04B 1/04* (2013.01)

(58) Field of Classification Search
CPC ................ H03F 1/30; H03F 3/20; H03G 3/30
USPC .................................................. 330/296, 285
See application file for complete search history.

(56) References Cited

U.S. PATENT DOCUMENTS

| | | | |
|---|---|---|---|
| 8,115,540 B2 | 2/2012 | Nose et al. | |
| 8,548,414 B2 * | 10/2013 | Chen | ...................... H03F 1/0244 455/311 |
| 9,490,758 B2 | 11/2016 | Okada | |
| 9,577,582 B2 * | 2/2017 | Botti | ...................... H03F 3/2171 |
| 9,590,829 B2 | 3/2017 | Egashira et al. | |
| 10,122,390 B2 | 11/2018 | Egashira et al. | |

FOREIGN PATENT DOCUMENTS

| | | |
|---|---|---|
| JP | 2007-258768 A | 10/2007 |
| JP | 2016-144012 A | 8/2016 |
| JP | 2017-147606 A | 8/2017 |
| WO | WO 2008/032782 A1 | 3/2008 |
| WO | WO 2014/103265 A1 | 7/2014 |

* cited by examiner

*Primary Examiner* — Henry Choe
(74) *Attorney, Agent, or Firm* — Oblon, McClelland, Maier & Neustadt, L.L.P.

(57) ABSTRACT

An amplification apparatus as the embodiment of the present invention includes a switching amplifier and an adjuster. The switching amplifier is driven on the basis of a control signal and amplifies an input signal to be amplified to generate an amplified signal. The adjuster adjusts the control signal before it is inputted into the switching amplifier. Specifically, the adjuster adjusts at least one of a pulse width of the control signal and a delay time of the control signal with respect to the signal to be amplified.

20 Claims, 11 Drawing Sheets

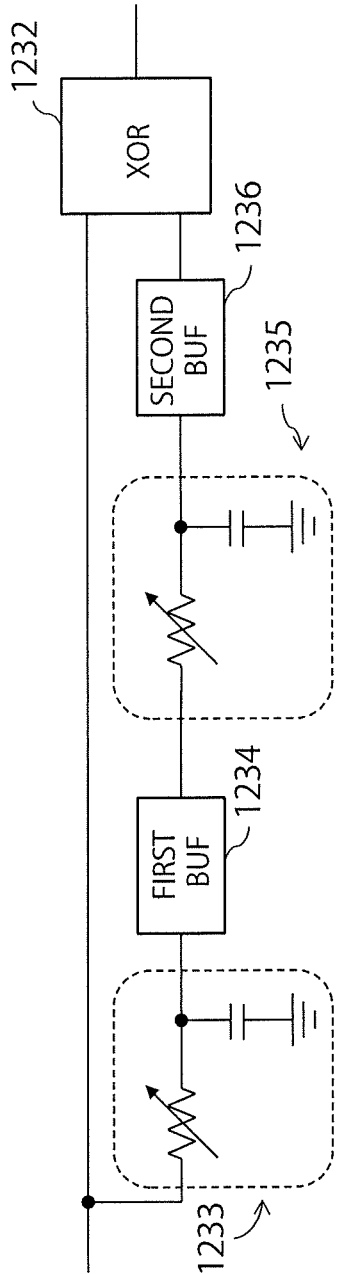
FIG. 10A
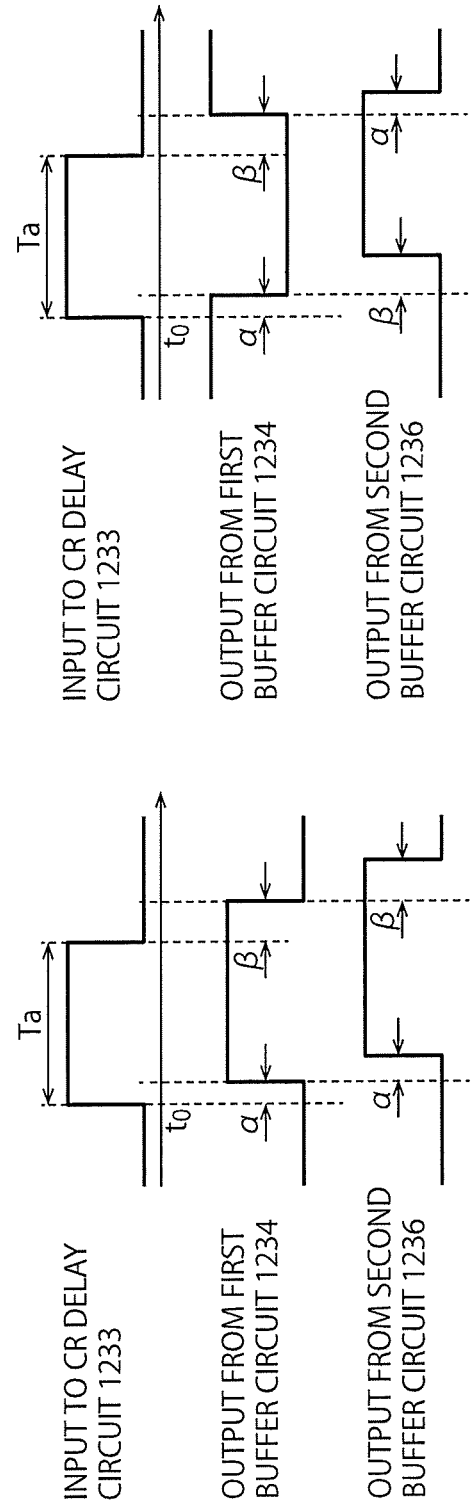
FIG. 10B
FIG. 10C

AMPLIFICATION APPARATUS AND TRANSMISSION APPARATUS

CROSS-REFERENCE TO RELATED APPLICATION (S)

This application is based upon and claims the benefit of priority from Japanese Patent Application No. 2019-047404, filed Mar. 14, 2019; the entire contents of which are incorporated herein by reference.

FIELD

Embodiments described herein relate generally to an amplification apparatus and a transmission apparatus.

BACKGROUND

Switching amplifiers used for amplification of rectangular signals are used in various apparatuses, but output signals from the switching amplifiers include harmonic components. Therefore, in general, it is necessary to separately provide a function to suppress these harmonic components. For example, multi-stage band-pass filters (BPFs), a load circuit for suppressing a particular harmonic, and the like are used together with the switching amplifiers.

However, if the function to suppress harmonics is separately provided, circuit scale will increase. In addition, there is also a problem of taking time for circuit adjustment due to an increase in circuit parameters.

BRIEF DESCRIPTION OF THE DRAWINGS

FIGS. 10A, 10B, and 10C are a circuit diagram and waveform diagrams illustrating a second implementation example of the adjuster of the third embodiment;

DETAILED DESCRIPTION

An embodiment of the present invention provides an amplification apparatus that suppresses harmonics of an output signal.

An amplification apparatus as the embodiment of the present invention includes a switching amplifier and an adjuster. The switching amplifier is driven on the basis of a control signal and amplifies an input signal to be amplified to generate an amplified signal. The adjuster adjusts the control signal before it is inputted into the switching amplifier. Specifically, the adjuster adjusts at least one of a pulse width of the control signal and a delay time of the control signal with respect to the signal to be amplified.

Below, a description is given of embodiments of the present invention with reference to the drawings. The present invention is not limited to the embodiments.

First Embodiment

Figure 1:
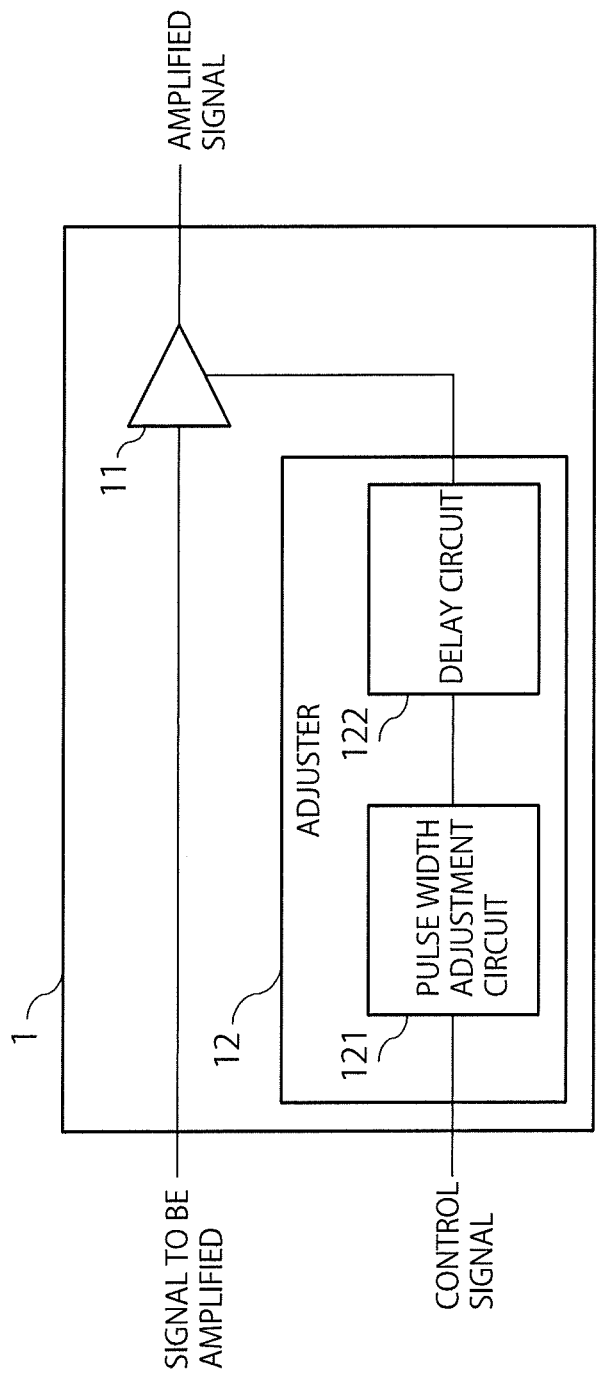
FIG. 1 is a block diagram illustrating an example of an amplification apparatus according to a first embodiment.

FIG. 1 is a block diagram illustrating an example of an amplification apparatus 1 according to a first embodiment. The amplification apparatus 1 according to the embodiment includes a switching amplifier 11 and an adjuster 12. The adjuster 12 includes a pulse width adjustment circuit 121 and a delay circuit 122.

The amplification apparatus 1 of the embodiment is an apparatus that amplifies a rectangular signal which is target for amplification and inputted into the amplification apparatus 1. Hereinafter, the signal which will be amplified is referred to as "signal to be amplified" and a signal which is already amplified is referred to as "amplified signal." It is assumed that the amplification apparatus 1 of the embodiment only have to amplify once in each of a section where the signal to be amplified is the maximum (HIGH) and a section where it is the minimum (LOW). A period when amplification is performed is not particularly determined.

The amplification apparatus 1 suppresses harmonic components included in the amplified signal even if it does not include a band-pass filter (BPF) or the like. Specifically, it suppresses the harmonic components by adjusting drive timing and a drive period of the switching amplifier 11 on the basis of the signal to be amplified.

The switching amplifier 11 amplifies an input signal to be amplified to generate an amplified signal during driving. Whether to amplify the signal is determined on the basis of a control signal inputted into the switching amplifier 11. That is, the control signal controls driving (ON/OFF) of the switching amplifier 11 and the switching amplifier 11 is driven on the basis of the control signal.

In the description, it is assumed that the control signal is represented by a binary value of 0 or 1. Then, when the value of the control signal is 1, it is assumed that the switching amplifier 11 is turned on and the amplified signal is output. When the value of the control signal is 0, it is assumed that the switching amplifier 11 is turned off and there is no output, in other words, 0 V is output.

As long as the switching amplifier 11 can be driven on the basis of the control signal and amplify the signal to be amplified, its configuration is not particularly limited. For example, the switching amplifier 11 can be implemented with a full bridge circuit. In the full bridge circuit, four transistors operating as switches are formed in a full bridge configuration.

Figure 2:
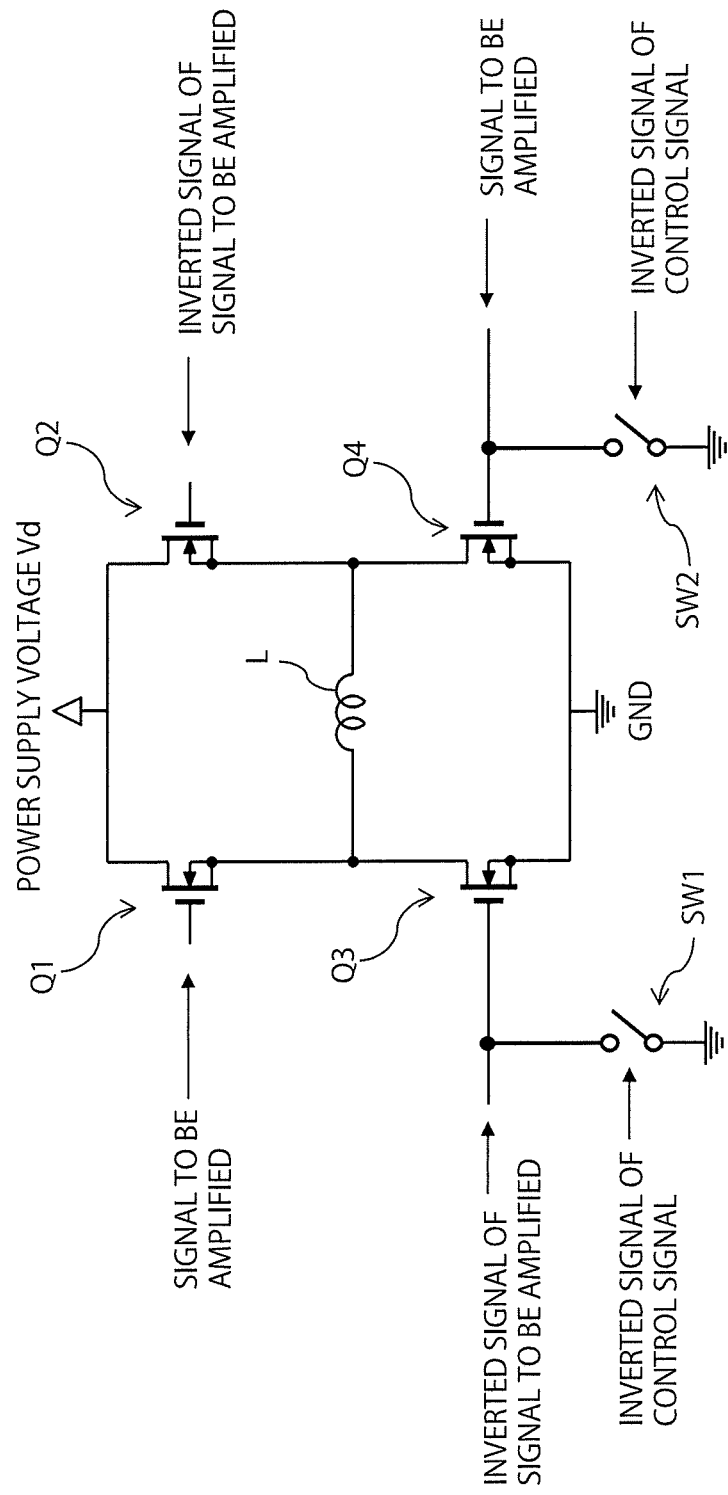
FIG. 2 illustrates an example of a configuration of a switching amplifier.

FIG. 2 illustrates an example of a configuration of the switching amplifier 11. FIG. 2 illustrates an example in which the switching amplifier 11 is implemented with a full bridge circuit. The four transistors are referred to as a first transistor Q1, a second transistor Q2, a third transistor Q3, and a fourth transistor Q4. Specifically, the first transistor Q1 and the second transistor Q2 are connected in parallel, and the third transistor Q3 and the fourth transistor Q4 are also connected in parallel. In addition, the first transistor Q1 and the third transistor Q3 are connected in series, and the second transistor Q2 and the fourth transistor Q4 are also connected in series.

A power supply voltage Vd is applied to a connection point between the first transistor Q1 and the second transistor Q2, and a connection point between the third transistor Q3 and the fourth transistor Q4 is connected to a ground (GND). The first transistor Q1 and the second transistor Q2 on the power supply voltage side are also referred to as first high-side transistor and second high-side transistor, respectively. The third transistor Q3 and the fourth transistor Q4 on the GND side are also referred to as first low-side transistor and second low-side transistor, respectively.

In the example of FIG. 2, one transformer L is built into the full bridge circuit. It is assumed that an amplified voltage is output via the transformer L. One end of the transformer L is connected to a connection point between the first transistor Q1 and the third transistor Q3. On the other hand, the other end of the transformer L is connected to a connection point between the second transistor Q2 and the fourth transistor Q4. In the example of FIG. 2, the power supply voltage is applied to the transformer L and thereby amplification is performed. That is, the transistors are controlled so that potential difference occurs between both ends of the transformer L when the control signal is 1, and potential difference does not occur between both ends of the transformer L when the control signal is 0.

Each transistor is controlled based on at least one of the signal to be amplified and the control signal. In the example of FIG. 2, the first transistor Q1 switches according to the input signal to be amplified. An inverted signal of the signal to be amplified is inputted into the second transistor Q2 and the second transistor Q2 switches according to the inverted signal. The third transistor Q3 switches according to the inverted signal of the signal to be amplified and an inverted signal of the control signal. In the example of FIG. 2, the inverted signal of the signal to be amplified is inputted into an input line of the third transistor Q3, and the input line is connected to a first switch SW1 that switches according to the inverted signal of the control signal. This allows the third transistor Q3 to switch according to the inverted signal of the signal to be amplified and the inverted signal of the control signal. The fourth transistor Q4 switches according to the signal to be amplified and the inverted signal of the control signal. In the example of FIG. 2, the signal to be amplified is inputted into an input line of the fourth transistor Q4, and the input line is connected to a second switch SW2 that switches according to the inverted signal of the control signal. This allows the fourth transistor Q4 to switch according to the signal to be amplified and the inverted signal of the control signal.

Each transistor turns on when a value of an input signal is equal to or more than a threshold value, and turns off when it is less than the threshold value, and the signal (signal to be amplified or its inverted signal) inputted into each transistor is a rectangular wave. Therefore, each transistor turns on when the signal is HIGH and turns off when it is LOW. In addition, it is assumed that each switch turns on when the value of the input signal is 1 (that is, when the control signal is 0) and turns off when it is 0 (that is, when the control signal is 1).

In the case of a configuration like FIG. 2, each low-side transistor does not turn on because each switch turns on and current flows to the GND when the control signal is 0. Consequently, current does not flow to the transformer L, and ideally, output power becomes 0. The switching amplifier 11 may be implemented with such a full bridge circuit that is driven on the basis of the signal to be amplified and the control signal.

The adjuster 12 adjusts the control signal inputted into the switching amplifier 11 before it is inputted into the switching amplifier 11. Specifically, the pulse width adjustment circuit 121 adjusts a pulse width and the delay circuit 122 adjusts a delay time with respect to the signal to be amplified.

In the embodiment, it is assumed that the adjuster 12 adjusts both pulse width and delay time, but any one of the pulse width and the delay time may be adjusted. In that case, a circuit that processes one not to be adjusted may be omitted.

The pulse width of the control signal after adjustment by the pulse width adjustment circuit 121 is referred to as "TON." That is, the control signal is adjusted by the pulse width adjustment circuit 121 before being inputted into the switching amplifier 11 and its pulse width becomes TON.

The delay time adjusted by the delay circuit 122 means a time length from switching of the signal to be amplified to first switching of the control signal. For example, when timing of switching from LOW to HIGH of the signal to be amplified is taken as a reference, it means the time length from the reference to timing when the control signal first switches from OFF to ON. The delay time of the control signal after adjustment is referred to as "DELAY." That is, the control signal is adjusted by the delay circuit 122 before being inputted into the switching amplifier 11 and its delay time becomes DELAY.

Figure 3:
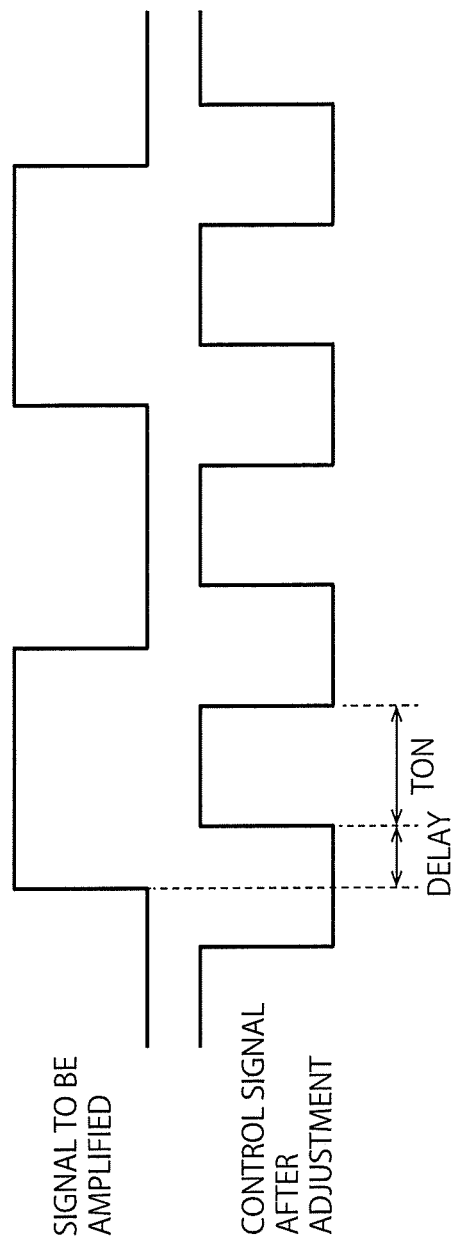
FIG. 3 illustrates waveforms of a signal to be amplified and a control signal inputted into the switching amplifier.

FIG. 3 illustrates waveforms of the signal to be amplified and the control signal inputted into the switching amplifier 11. The control signal is after adjustment by the pulse width adjustment circuit 121 and the delay circuit 122. Therefore, the pulse width of the control signal is TON and the delay time is DELAY.

In the embodiment, it is assumed that the control signal is generated by an external apparatus of the amplification apparatus 1, and inputted into the amplification apparatus 1. It is also assumed that the control signal is generated so as to have a half cycle of a cycle of the signal to be amplified. Therefore, timing (rise) when the control signal changes from OFF to ON and timing (fall) when the control signal changes from ON to OFF occur once for each even if the signal to be amplified is in the high section or in the low section. A value of duty ratio of the control signal may be determined freely.

Inventors have discovered that a power level (power spectrum) of harmonics changes when the pulse width and the delay time are adjusted like this. Therefore, it is possible to suppress the power level of the harmonics by appropriately adjusting the pulse width and the delay time.

Figure 4:
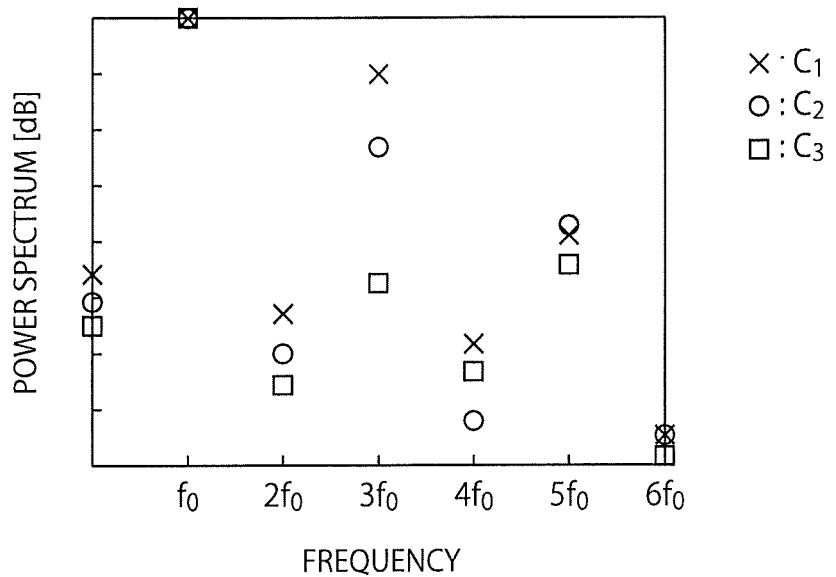
FIG. 4 illustrates power levels of frequency components of an amplified signal when a pulse width is adjusted.

FIG. 4 illustrates power levels of frequency components of an amplified signal when the pulse width is adjusted. A fundamental wave is represented as a frequency $f_0$ and an Nth harmonic is represented as $Nf_0$, where N is an integer of two or more. For example, $3f_0$ represents a third harmonic.

FIG. 4 shows power levels of amplified signals by three types of control signals ($C_1$, $C_2$, and $C_3$) with different TON. Note that the delay amount of the control signals is the same. As shown in FIG. 4, it can be seen that the power levels of the frequency components of the amplified signals are different according to TON. Therefore, if TON is adjusted to an appropriate value, the power level of the harmonics can be suppressed. For example, when it is desired to suppress the third harmonic component, it is understood that the control signal $C_3$ may be used among the three types of control signals.

In the example of FIG. 4, a frequency of the signal to be amplified is 500 kHz, TON of the control signal $C_1$ is 200 ns, TON of the control signal $C_2$ is 400 ns, and TON of the control signal $C_3$ is 600 ns. The delay time of the control signals is not adjusted and the delay time is 0. Reduction in the power levels of the frequency components is not proportional to the magnitude of TON. Optimal TON is different depending on the fundamental frequency. Therefore, an adjustment amount of the pulse width adjustment circuit 121 needs to be determined in advance on the basis of the frequency of the signal to be amplified to be used, a harmonic to be suppressed, and the like.

Figure 5:
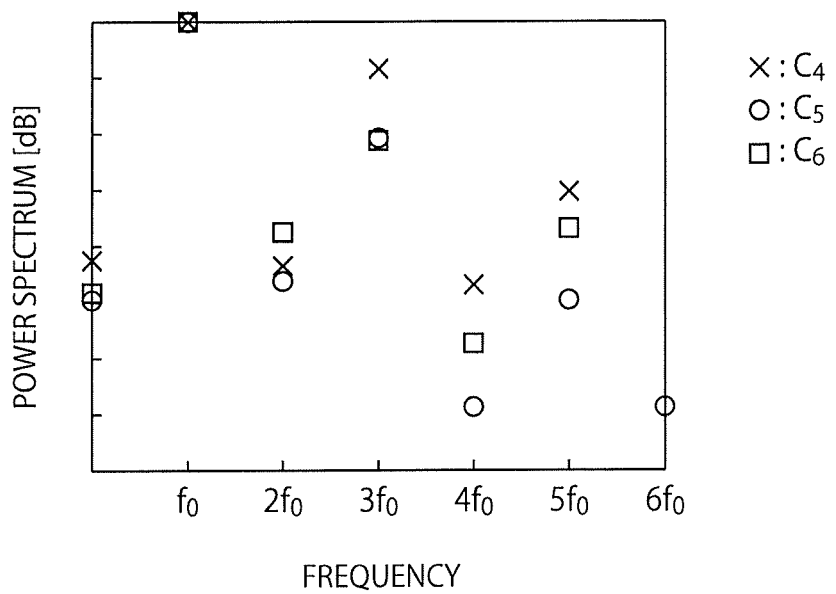
FIG. 5 illustrates power levels of frequency components of an amplified signal when a delay time is adjusted.

FIG. 5 illustrates power levels of the frequency components of the amplified signal when the delay time is adjusted. In the same way as FIG. 4, the fundamental wave is represented by the sign $f_0$ and the Nth harmonic is represented by $Nf_0$.

FIG. 5 shows power levels of amplified signals by three types of control signals ($C_4$, $C_5$, and $C_6$) with different DELAY. Note that each TON of the control signals is the same. From FIG. 5, it can be seen that the power levels of the frequency components of the amplified signals are different according to DELAY. Therefore, if DELAY is adjusted to an appropriate value, the power level of the harmonics can be suppressed. For example, when it is desired to suppress the fifth harmonic component, it is understood that the control signal $C_5$ may be used among the three types of control signals.

In the example of FIG. 5, the frequency of the signal to be amplified is 500 kHz, DELAY of the control signal $C_4$ is 90 ns, DELAY of the control signal $C_5$ is 20 ns, and DELAY of the control signal $C_6$ is 40 ns. The pulse width of the control signals is not adjusted and the pulse width is 200 ns. Reduction in the power levels of the frequency components is not proportional to the magnitude of DELAY. Optimal DELAY is different depending on the fundamental frequency. Therefore, an adjustment amount of the delay circuit 122 also needs to be determined in advance on the basis of the frequency of the signal to be amplified to be used, a harmonic to be suppressed, and the like.

When TON and DELAY are continuously changed, the pulse width adjustment circuit 121 and the delay circuit 122 can be implemented with variable resistors and the like. When TON and DELAY are discretely changed, the pulse width adjustment circuit 121 and the delay circuit 122 can be implemented with switches and the like.

The pulse width adjustment circuit 121 and the delay circuit 122 may store tables representing a relationship between the frequency of the signal to be amplified and the adjustment amount and change the adjustment amount according to the frequency of the signal to be amplified. This allows good characteristics to be obtained for any frequencies. In that case, a circuit for measuring the frequency of the signal to be amplified may be additionally provided for the amplification apparatus 1.

Strictly speaking, it is preferable that DELAY of the control signal is a desired value at a time point when the control signal is processed by the switching amplifier 11. Even if the delay time of the control signal with respect to the signal to be amplified is adjusted to the desired value in the adjuster 12, it is presumed that DELAY is increased or decreased by circuit delay until the control signal reaches gate terminals of the respective transistors in the switching amplifier 11. Therefore, it is desirable that it is desirable that the adjuster 12 adjusts so that the timing of switching of the control signal and the signal to be amplified is aligned at the time point when they are processed by the switching amplifier 11 rather than completely aligned at the time point of adjustment. That is, the delay circuit 122 may operate to absorb circuit delay until the signal to be amplified is applied to the switching amplifier 11.

For example, if the signal to be amplified is delayed by a time $T_m$ until it is applied to the gate terminals of the switching amplifier 11, the delay circuit 122 may output a signal delayed by the time $T_m$ in addition to assumed DELAY. In that case, actual DELAY of the signal output from the delay circuit 122 is represented by "assumed DELAY+$T_m$." Also, there is delay by circuits inside the adjuster 12, that is, delay by a pulse width and frequency adjustment circuit 123 and a delay by the delay circuit 122. If the signal is delayed by a time $T_c$ by the circuits inside the adjuster 12, the delay circuit 122 may output a signal delayed by difference obtained by subtracting the delay time $T_c$ of the control signal from the delay time $T_m$ of the signal to be amplified in addition to assumed DELAY. In that case, actual DELAY of the signal output by the delay circuit 122 is represented by "assumed DELAY+$T_m$−$T_c$."

Thus, the adjuster 12 adjusts at least one of the pulse width and the delay time of the signal to be amplified to be TON or DELAY corresponding to the frequency of the signal to be amplified. This causes the switching amplifier 11 to generate an amplified signal in which the power level of the harmonics is lower than that before adjustment by the adjuster 12.

When the amplified signal is output using the transformer as shown in FIG. 2, a coupling coefficient between the transformer of the amplification apparatus 1 and a transformer of an output destination may be intentionally lowered. When the coupling coefficient is low, leakage inductance occurs and the leakage inductance makes it difficult to transmit frequencies in a higher band. Therefore, the power level of the harmonics of the output destination can be suppressed by changing the arrangement or configuration of the transformers such that the coupling coefficient between the transformer of the amplification apparatus 1 and the transformer of the output destination is equal to or less than a predetermined upper limit value. For example, if the upper limit value is made 0.9, the power level of the harmonics can be clearly reduced.

In order to lower the coupling coefficient, it is considered to, for example, increase distance between the transformer's primary side and secondary side, make a difference in axial inclination of the transformer's primary side and secondary side, and shift centers of the transformer's primary side and secondary side. Furthermore, it is also considered to loosely wind a wire around a core material. When the wire wound around the core material is closely without any gap, the coupling coefficient is increased, so it is conceivable to lower the coupling coefficient by winding with a gap. In the case of using a plurality of transformers, it is conceivable that, for example, the wire is not wound around each of the secondary-side core material of each transformer and the wire is wound around so as to hold a plurality of core materials together. After all, it is possible to suppress the coupling coefficient by intentionally leaking magnetic flux by changing the arrangement of the transformers, the configuration such as how to wind, or the like.

As described above, according to the first embodiment, the pulse width and delay time of the control signal are adjusted to make the driving timing and driving period of the switching amplifier 11 appropriate. Hence, the power level of the harmonics of the amplified signal is lowered than that before the adjustment by the adjuster. Therefore, even the amplification apparatus 1 of the first embodiment in which the simple circuits are added to the switching amplifier 11 can suppress the harmonics included in the amplified signal. Thus, the circuits can be prevented from becoming complicated, and manufacturing cost of the circuits and the like can be kept down.

Second Embodiment

In a second embodiment, a case will be described in which a plurality of switching amplifiers 11 are uniformly driven to raise an amplitude level of the amplified signal than when one switching amplifier 11 is driven.

Figure 6:
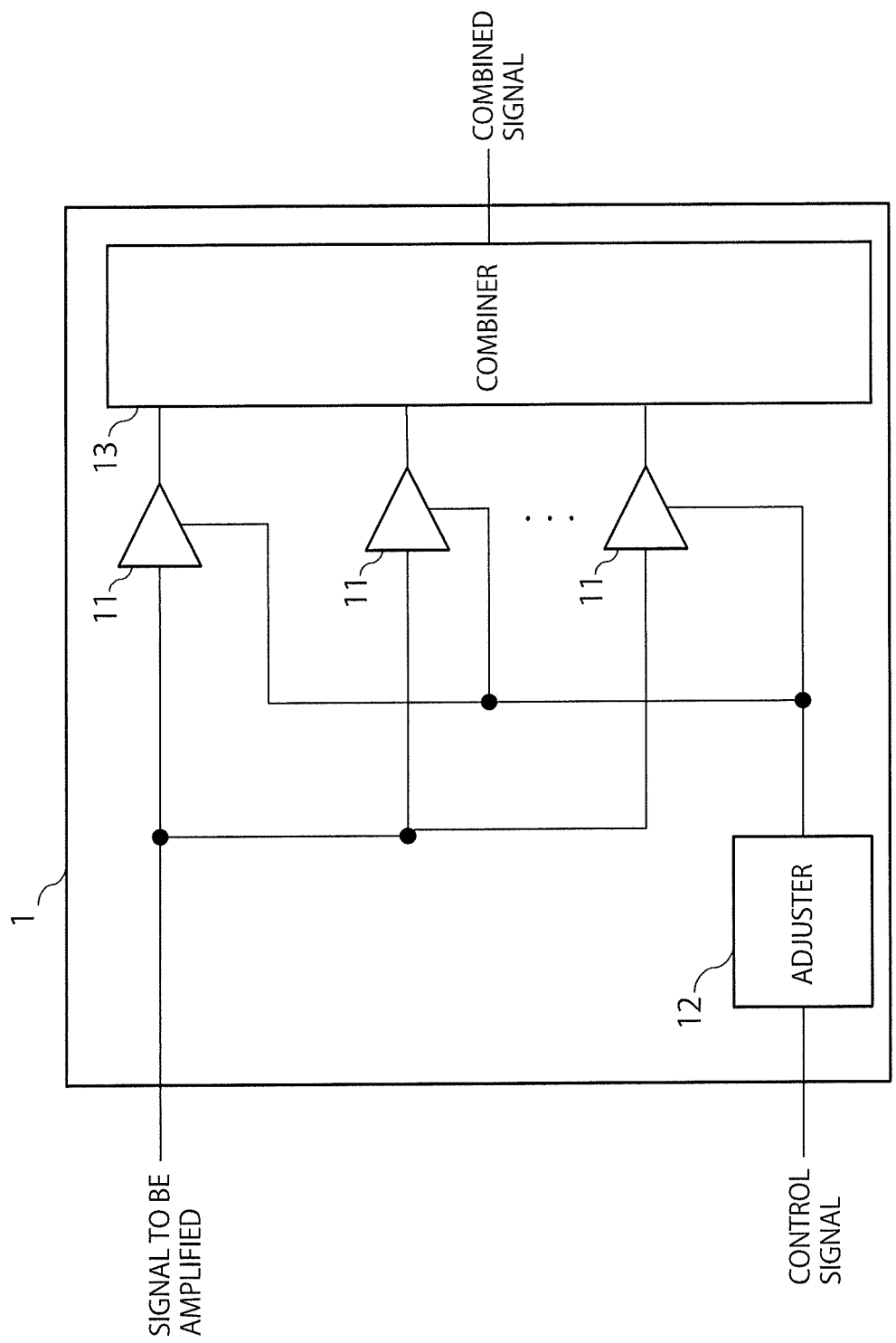
FIG. 6 is a block diagram illustrating an example of an amplification apparatus according to a second embodiment.

FIG. 6 is a block diagram illustrating an example of an amplification apparatus 1 according to the second embodiment. The amplification apparatus 1 according to the embodiment includes the plurality of switching amplifiers 11, an adjuster 12, and a combiner 13.

It is also possible to use a plurality of amplification apparatuses 1 of the first embodiment when it is desired to raise the amplitude level of the amplified signal by uniformly driving the plurality of switching amplifiers 11. However, TON and DELAY of the control signal inputted into the switching amplifier 11 of each amplification apparatus 1 are the same for all the amplification apparatuses 1. Therefore, it is not necessary to include a plurality of adjusters 12. Consequently, in the embodiment, the adjusted control signal from one adjuster 12 is distributed to the plurality of switching amplifiers 11. As a result, manufacturing cost of the amplification apparatus 1 can be reduced.

The adjuster 12 operates in the same manner as the first embodiment. The control signal adjusted by the adjuster 12 is distributed and inputted into the switching amplifiers 11. In addition, the signal to be amplified is also distributed and inputted into the switching amplifiers 11. As a result, the switching amplifiers 11 are driven at the same timing and operate in the same manner as in the first embodiment.

Figure 7:
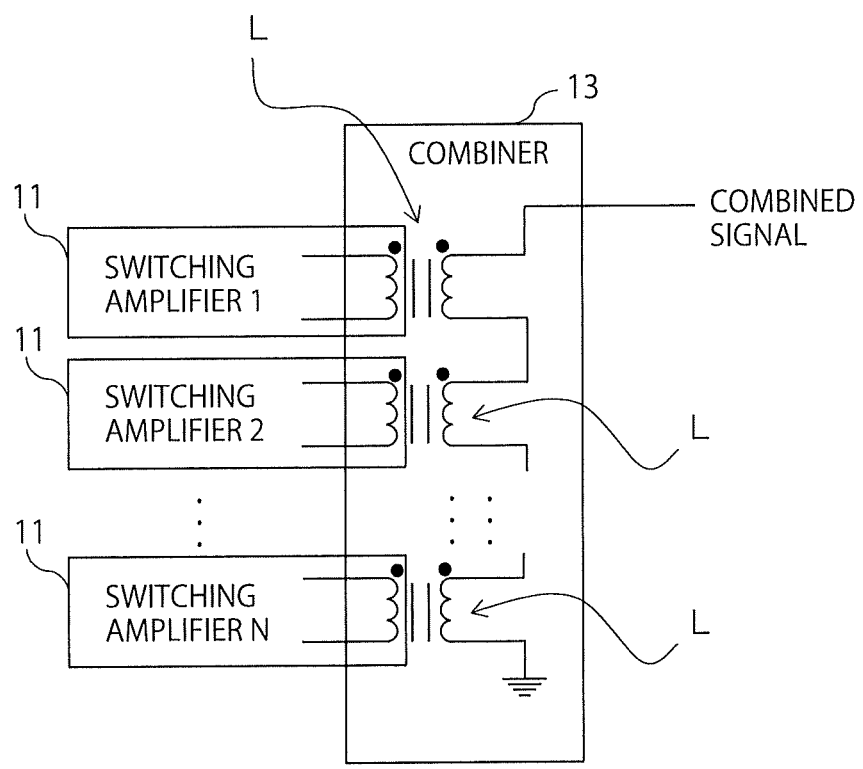
FIG. 7 illustrates an example of a combiner.

The combiner 13 combines the amplified signals from the switching amplifiers 11. FIG. 7 illustrates an example of the combiner 13. In the example of FIG. 7, the combiner 13 is implemented with transformers. The combiner 13 of the example of FIG. 7 includes the transformers the number of which is equal to or more than the number of the switching amplifiers 11 in order to receive output power from the switching amplifiers 11. The transformers of the combiner 13 are connected in series, one end of the whole connected transformers is grounded, and the other end outputs a signal after combination (combined signal). Such a configuration causes the amplified signals from the switching amplifiers 11 to be voltage-added and output as the combined signal.

The harmonics of the amplified signal output by the switching amplifier 11 are suppressed as described in the first embodiment. This applies even if there are a plurality of switching amplifiers 11. In addition, harmonics do not occur in combination by the combiner 13. Consequently, the harmonics of the combined signal from the combiner 13 are also suppressed.

As described in the first embodiment, in order to suppress the power level of the harmonics, the arrangement or configuration of the transformers inside the combiner 13 may be changed so that the coupling coefficient with the switching amplifiers 11 is equal to or less than an upper limit value.

As described above, according to the second embodiment, even if the amplitude level of the amplified signal is raised by using the plurality of switching amplifiers 11, the harmonics of the combined signal to be output can be suppressed. In addition, since complicated processing such as adjusting the control signal is not performed for each of the switching amplifiers 11, the circuits inside the amplification apparatus 1 can be simplified and manufacturing cost of the circuits and the like can be reduced.

Third Embodiment

In a third embodiment, a case will be described in which a control signal is generated from the signal to be amplified instead of receiving the control signal from the outside.

Figure 8:
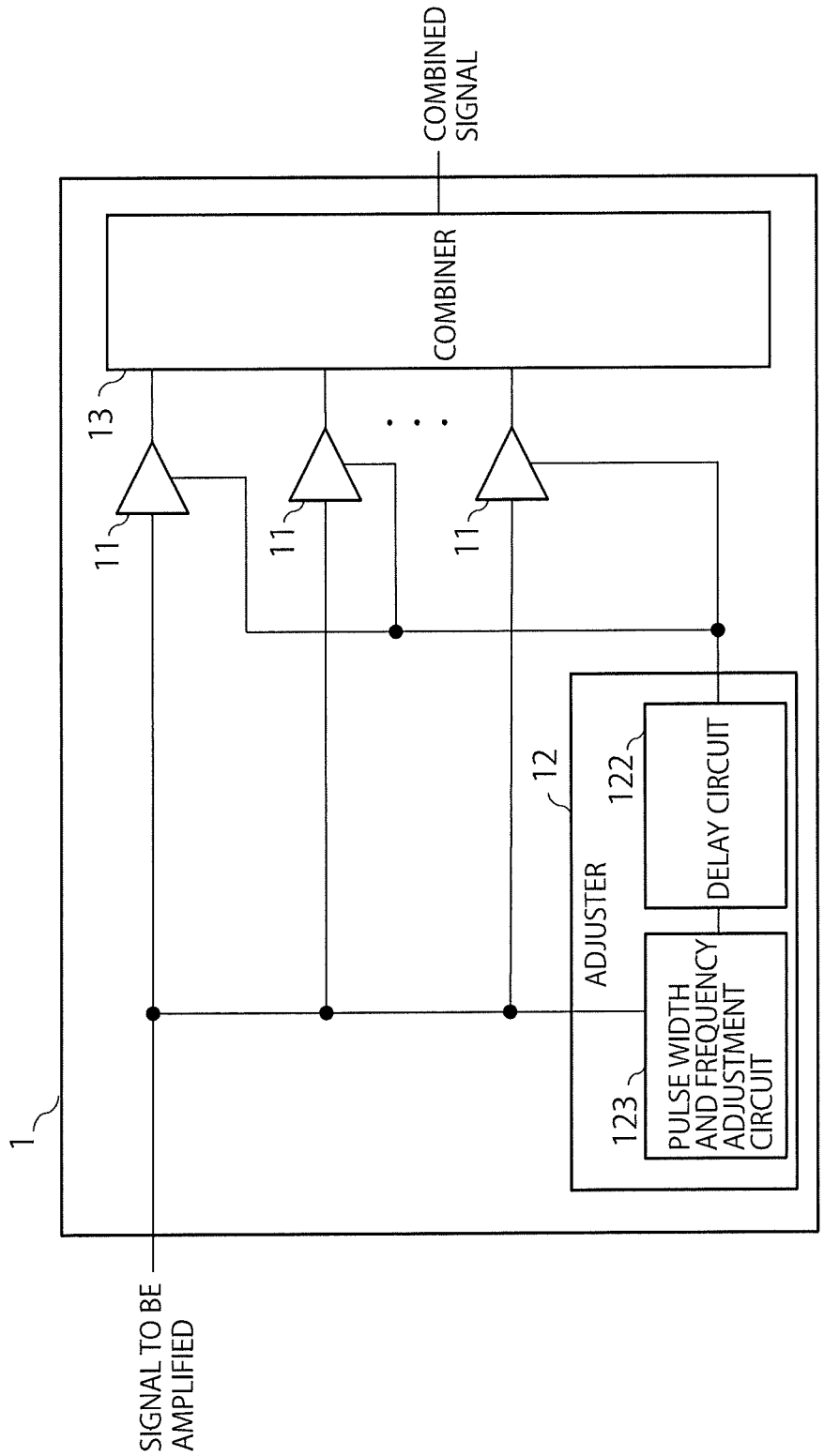
FIG. 8 is a block diagram illustrating an example of an amplification apparatus according to a third embodiment.

FIG. 8 is a block diagram illustrating an example of an amplification apparatus 1 according to the third embodiment. The amplification apparatus 1 according to the embodiment is different from the previous embodiments in that an adjuster 12 multiplies a frequency. The example of FIG. 8 shows a pulse width and frequency adjustment circuit 123 that adjusts both pulse width and frequency instead of the pulse width adjustment circuit 121.

Although the example of FIG. 8 shows the case where there are a plurality of switching amplifiers as in the second embodiment, there may be one switching amplifier as in the first embodiment.

The adjuster 12 of the embodiment generates a control signal from the signal to be amplified. Therefore, the adjuster 12 can be also called a control signal generator. The pulse width and frequency adjustment circuit 123 can double the frequency and outputs a signal of which the pulse width is TON and the cycle is half the cycle of the signal to be amplified.

Figure 9:
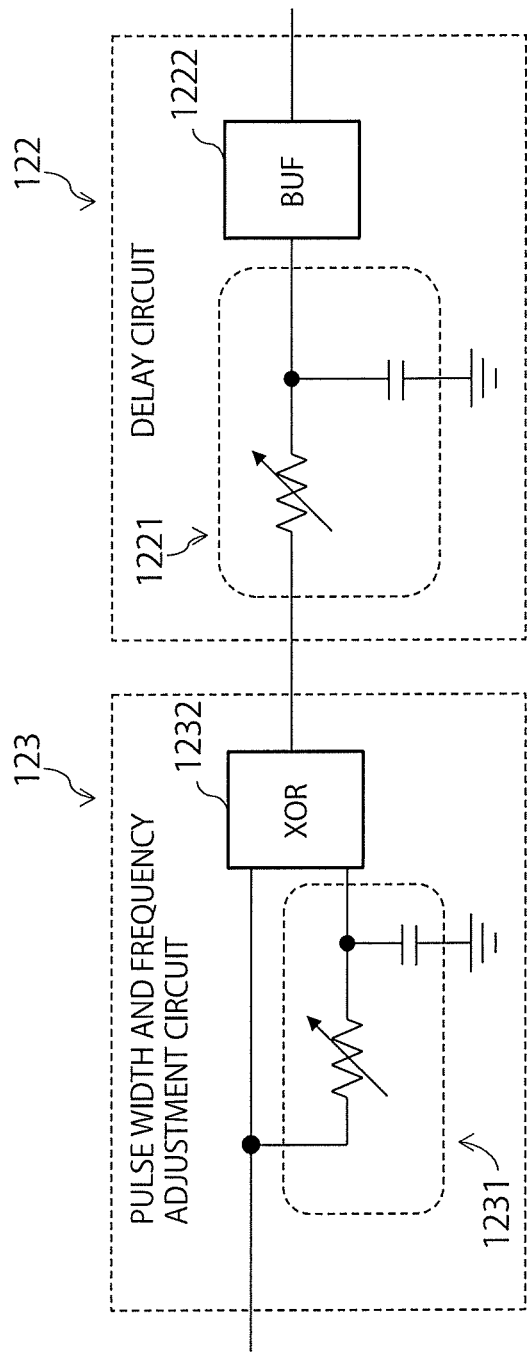
FIG. 9 is a circuit diagram illustrating a first implementation example of an adjuster of the third embodiment.

FIG. 9 is a circuit diagram illustrating a first implementation example of the adjuster 12 of the third embodiment. The signal to be amplified inputted into circuits of FIG. 9 branches off and enters a CR delay circuit 1231 including a capacitor and a resistor, and an XOR circuit (exclusive logical sum circuit) 1232. The resistor of the CR delay circuit 1231 is a variable resistor and the signal to be amplified can be delayed according to a change in value of the variable resistor. The signal analogously delayed by the CR delay circuit 1231 is output and inputted into the XOR circuit 1232. The XOR circuit is used as a doubler and a doubled signal in frequency is output as an XOR circuit output. In other words, the cycle of the output signal of the XOR circuit 1232 is half the cycle of the input signal of the XOR circuit 1232. The pulse width of the output of the XOR circuit 1232 can be adjusted by adjusting the value of the variable resistor of the CR delay circuit 1231. In addition, in order to make a large pulse width a reality in the output signal of the XOR circuit, it is also possible to connect in series a plurality of combinations (units) of the CR delay circuit 1231 and a buffer circuit or the like provided for its output.

The signal output from the XOR circuit 1232 is analogously delayed by the CR delay circuit 1221 and inputted into a buffer circuit 1222. The buffer circuit 1222 converts the input signal into a digital signal. Thus, the adjuster 12 that multiplies the frequency can be implemented.

There is a risk that threshold value variations or the like of logic ICs may have an impact on performance when the XOR circuit 1232, the buffer circuit 1222, and the like shown in FIG. 9 are implemented with the logic ICs. For example, when the large pulse width is made in a reality, there is a case of adopting a configuration that connects in series a plurality of units including a CR delay circuit and a buffer circuit or the like for receiving its output, instead of the CR delay circuit 1231 in FIG. 9. Especially, in such a configuration, a duty ratio of an output signal of a configuration connecting in series the plurality of units is sometimes deviated from 50% due to imbalance between a threshold value of the buffer circuits and a threshold value of HIGH or LOW of the XOR circuits 1232. As a result, the duty ratio of the output signal pulse of the XOR circuit 1232 becomes different between even-numbered output and odd-numbered output and an imbalance occurs. The same problem may occur due to deviation of the threshold values of HIGH and LOW of the XOR circuit 1232. In order to avoid this, it is conceivable that 2M units are provided, where M is an integer of one or more, and an inverting buffer is used as a buffer circuit for each unit.

FIG. 10 is a circuit diagram illustrating a second implementation example of the adjuster 12 of the third embodiment. FIG. 10A shows a CR delay circuit 1233, a first buffer circuit 1234, a CR delay circuit 1235, and a second buffer circuit 1236 instead of the CR delay circuit 1231 of FIG. 9. The CR delay circuit 1233 and the first buffer circuit 1234 form a first unit, and the CR delay circuit 1235 and the second buffer circuit 1236 form a second unit. Note that it is assumed that values of variable resistors of the CR delay circuit 1233 and the CR delay circuit 1235 are the same.

FIG. 10B shows a change in waveform of the signal to be amplified inputted into the circuits of FIG. 10A when the first buffer circuit 1234 and the second buffer circuit 1236 are non-inverting buffers. The top waveform of FIG. 10B represents a waveform at a time point when the signal to be amplified is inputted into the CR delay circuit 1233. A symbol "$t_0$" denotes a time point of rise of the signal to be amplified. The pulse width at this time point is "$T_A$." The second waveform of FIG. 10B represents a waveform at a time point output from the buffer circuit 1234. The rise time point is changed to "$t_0+\alpha$" and the fall time point is changed to "$t_0+T_A+\beta$" by the first unit. The third waveform of FIG. 10B represents a waveform at a time point output from the buffer circuit 1236. The second unit also applies the same amount of change as that of the first unit to the signal to be amplified. Therefore, the rise time point changes "$t_0+2\alpha$" and the fall time point changes to "$t_0+T_A+2\beta$." Consequently, the difference in pulse width is "$2\beta-2\alpha$."

FIG. 10C shows a change in waveform of the signal to be amplified which is inputted into the circuits of FIG. 10A when the second buffer circuit 1236 is an inverting buffer. The top waveform of FIG. 10C represents a waveform at a time when the signal to be amplified is inputted into the CR delay circuit 1233. The waveform is the same as the waveform of the top of FIG. 10B. The second waveform of FIG. 10C represents a waveform at a time point output from the buffer circuit 1234. In the case of FIG. 10C, the rise time point "$t_0$" is delayed by "$\alpha$," because the signal to be amplified is delayed and inverted and it becomes a fall time point. On the other hand, the fall time point "$t_0+T_A$" is delayed by "$\beta$," and becomes a rise time point. As a result, as shown in FIG. 10C, the fall time point changes to "$t_0+\alpha$" and the rise time point changes to "$t_0+T_A+\beta$." The third waveform of FIG. 10C represents a waveform at a time point output from the buffer circuit 1236. Here, as the signal to be amplified is delayed and inverted also, the fall time point "$t_0+\alpha$" is delayed by "$\beta$," and becomes a rise time point. On the other hand, the rise time point "$t_0+T_A+\beta$" is delayed by "$\alpha$," and becomes a fall time point. As a result, as shown in FIG. 10C, the rise time point changes to "$t_0+\alpha+\beta$" and the fall time point changes to "$t_0+T_A+\alpha+\beta$." Therefore, the difference in pulse width becomes 0.

In such a configuration, the signal output from the XOR circuit 1232 has less disturbance of the pulse waveform due to variation of the threshold values by adjusting each of the values of the variable resistors so as to cancel out the deviation of the threshold values.

As described above, according to the third embodiment, it is possible to generate the control signal from the signal to be amplified.

Fourth Embodiment

In the second and third embodiments, it is assumed that a plurality of switching amplifiers 11 are uniformly driven. However, it is also conceivable to drive some of the plurality of switching amplifiers 11 and stop the rest. For example, if the signal to be amplified is a modulation signal, it is also conceivable to dynamically change a driven number of switching amplifiers 11 according to an amplitude level of the modulation signal.

Figure 11:
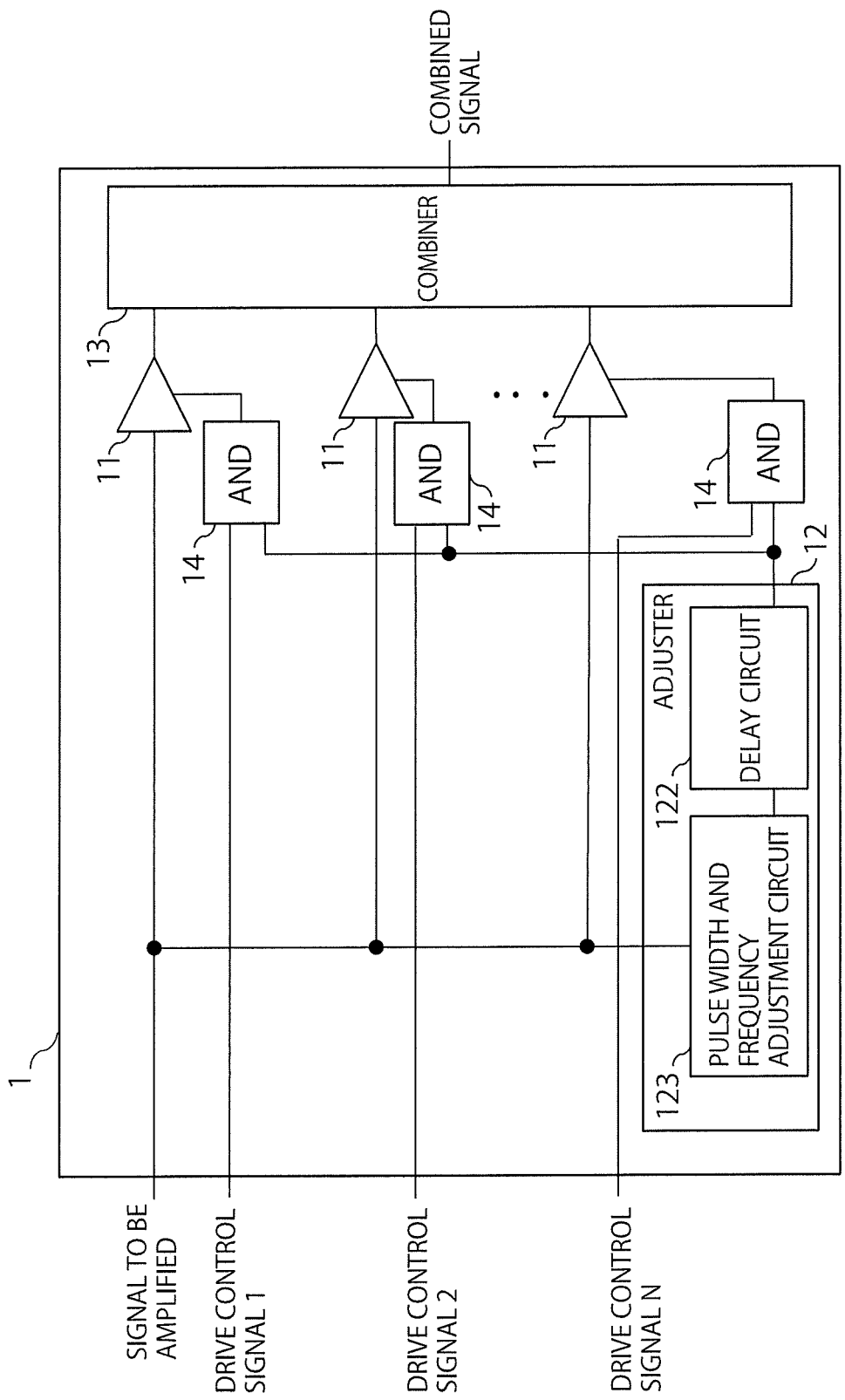
FIG. 11 is a block diagram illustrating an example of an amplification apparatus according to a fourth embodiment.

FIG. 11 is a block diagram illustrating an example of an amplification apparatus according to a fourth embodiment. In the embodiment, the amplification apparatus 1 of the third embodiment further includes a plurality of AND circuits 14. In addition, the embodiment is different from the previous embodiments in that the amplification apparatus 1 receives a plurality of drive control signals.

The AND circuits 14 are provided for the respective switching amplifiers 11, receive the signal output from the adjuster 12 and a corresponding drive control signal, and output a logical product of those to the switching amplifiers 11. In other words, the control signal given to each switching amplifier 11 in the embodiment is a signal obtained by AND operation of the signal output from the adjuster 12 and the drive control signal corresponding to each switching amplifier 11.

The drive control signal is a signal for determining whether to operate the switching amplifier 11. It is assumed that the drive control signal is also represented by a binary value of 0 or 1 in the same way as the control signal. When the drive control signal is 1, the switching amplifier 11 operates according to the control signal because the output of the AND circuit 14 is the same as the value of the control signal. When the drive control signal is 0, the switching amplifier 11 does not operate because the output of the AND circuit 14 is 0. That is, the drive control signal may be considered as a signal for determining whether the control signal to be given to the switching amplifier 11 is valid or invalid.

The switching amplifiers may be grouped, and the drive control signal may be received for each group. In this case, the number of the drive control signals is smaller than N. Therefore, when there are N switching amplifiers, the amplification apparatus 1 receives up to N drive control signals.

As described above, according to the fourth embodiment, it is possible to dynamically change the driven number of switching amplifiers in the configuration in which a plurality of switching amplifiers 11 are operated in parallel according to the drive control signal and their outputs are combined.

Fifth Embodiment

In a fifth embodiment, an application example to a transmission apparatus 2 is shown as a utilization example of the amplification apparatus 1.

Figure 12:
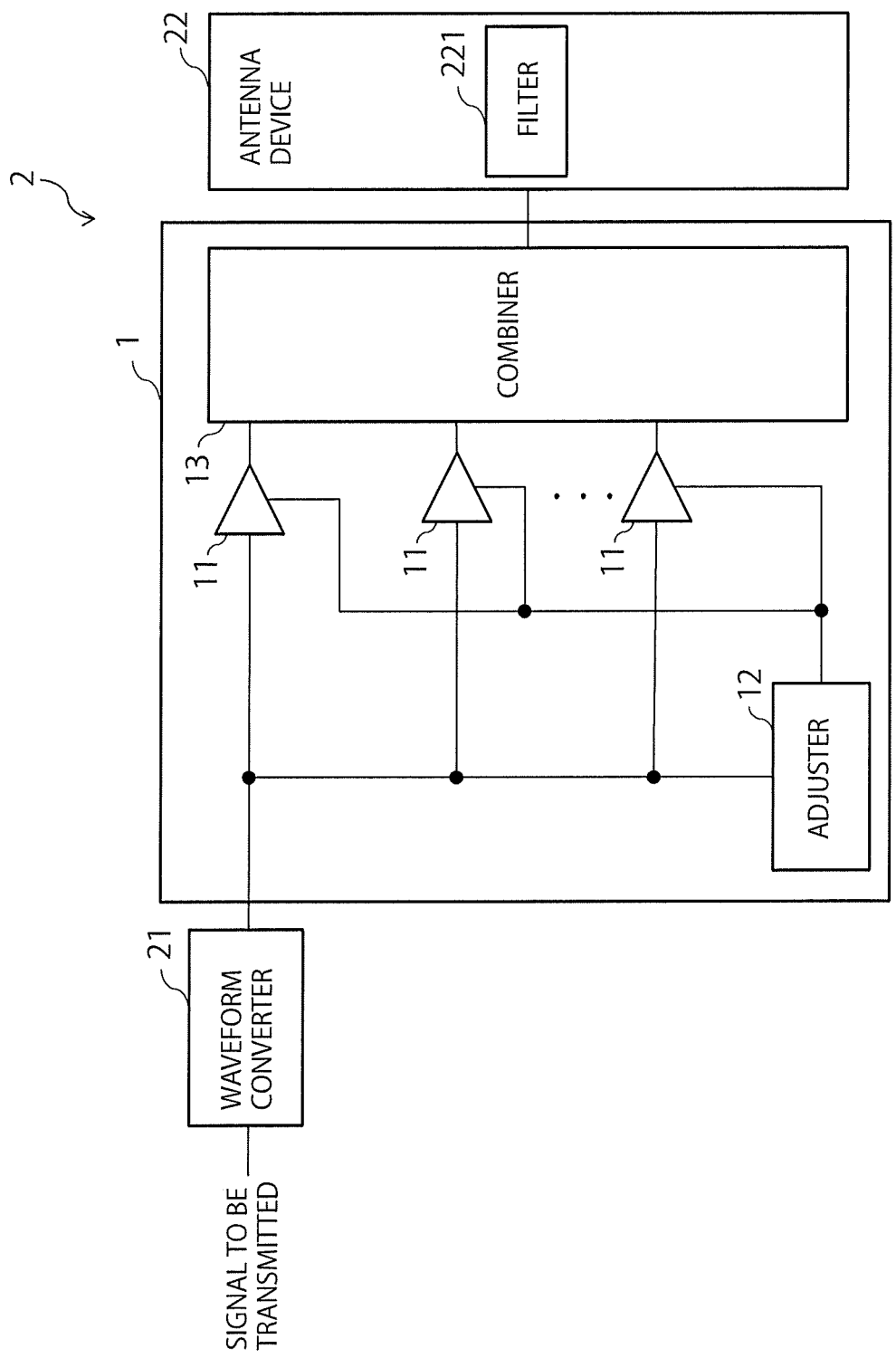
FIG. 12 is a block diagram illustrating an example of a transmission apparatus according to a fifth embodiment.

FIG. 12 is a block diagram illustrating an example of the transmission apparatus 2 according to the fifth embodiment. The transmission apparatus 2 according to the embodiment includes a waveform converter 21, the amplification apparatus 1 of the third embodiment, and an antenna device 22.

The transmission apparatus 2 of the embodiment is an apparatus that amplifies an input signal and transmits it. The signal inputted into the transmission apparatus 2 is referred to as signal to be transmitted. The signal to be transmitted is not particularly limited, and a non-modulated carrier signal, a modulated signal generated by modulating a signal including information to be transmitted on the basis of a carrier signal, and the like are considered.

Although an example to apply the amplification apparatus 1 to the transmission apparatus 2 that performs processing like described above is shown in order to demonstrate the effectiveness of the amplification apparatus 1, application destinations of the amplification apparatus 1 are not necessarily limited.

The waveform converter 21 performs threshold value determination on the signal to be transmitted, and converts the signal to be transmitted into HIGH or LOW. This converts the waveform of the signal to be transmitted into a rectangular wave. A signal of the converted rectangular wave is referred to as rectangular wave signal to be transmitted. Note that the waveform converter 21 may be omitted if a rectangular wave signal is inputted into the amplification apparatus 1.

The amplification apparatus 1 receives the rectangular wave signal to be transmitted as a signal to be amplified. The processing of the amplification apparatus 1 is as described in the third embodiment. That is, a control signal is generated by the adjuster 12 from the rectangular wave signal to be transmitted, amplified signals of the rectangular wave signal to be transmitted are generated by the switching amplifiers 11, and a combined signal of the amplified signals is generated by the combiner 13. In addition, as described in the third embodiment, the harmonics of the combined signal are reduced.

The antenna device 22 includes at least an antenna and transmits the combined signal from the combiner 13 by radio wave via the antenna. The antenna device 22 may include its own amplifier, filter, or the like. FIG. 12 shows a filter 231 inside the antenna device 22. Note that the filter 231 may be any filter as long as it can remove frequency components to be deleted. For example, as general filters, there are a band-pass filter that passes only a desired signal band, a low-pass filter that passes below a desired frequency, and a bypass filter that passes above a desired frequency, and the filter 231 may be any of them. Note that the filter 231 may be present independently of the antenna device. The combined signal from the combiner 13 may be transmitted to the antenna device via the filter 231.

As described above, the transmission apparatus 2 of the present embodiment including the amplification apparatus 1 of the third embodiment can transmit the combined signal with the harmonics suppressed. As a result, required specifications of the BPF are relaxed or the BPF becomes unnecessary, so that manufacturing cost of the transmission apparatus 2 can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An amplification apparatus comprising:
a plurality of switching amplifiers, each of the switching amplifiers being configured to be driven on the basis of a control signal and amplify an input signal to be amplified to generate an amplified signal;
a combiner configured to combine amplified signals from the respective switching amplifiers to generate a combined signal;
an adjuster configured to adjust at least one of a pulse width of the control signal or a delay time of the control signal with respect to the input signal before the control signal is input into the switching amplifier; and
one or more AND circuits configured to output the adjusted control signals into the switching amplifiers corresponding thereto on the basis of the adjusted control signal and signals that determine driving of the switching amplifiers.

2. The amplification apparatus according to claim 1, wherein
the adjuster adjusts the control signal to have a pulse width or a delay time corresponding to a frequency of the input signal.

3. The amplification apparatus according to claim 1, wherein
a power level of harmonics of the amplified signal is lower than that of a signal generated by the switching amplifier on the basis of control signal unadjusted 1w the adjuster.

4. The amplification apparatus according to claim 1, wherein
the adjuster adjusts both of the pulse width and the delay time.

5. The amplification apparatus according to claim 1, wherein
the switching amplifier includes a full bridge circuit that is driven on the basis of input signal and the control signal.

6. The amplification apparatus according to claim 5, wherein
the full bridge circuit includes:
a first high-side transistor;
a second high-side transistor connected in parallel with the first high-side transistor;
a first low-side transistor connected in series with the first high-side transistor; and
a second low-side transistor connected in series with the second high-side transistor and in parallel with the first low-side transistor, and
the first low-side transistor and the second low-side transistor switch on the basis of the control signal.

7. The amplification apparatus according to claim 6, wherein
the full bridge circuit further includes a transformer,
one end of the transformer is connected to a connection point between the first high-side transistor and the first low-side transistor, and
the other end of the transformer is connected to a connection point between the second high-side transistor and the second low-side transistor.

8. The amplification apparatus according to claim 1, wherein
the combiner combines the output amplified signals by voltage addition.

9. The amplification apparatus according to claim 8, wherein
each coupling coefficient between the combiner and each of the switching amplifiers is equal to or less than 0.9.

10. The amplification apparatus according to claim 1, wherein the adjuster adjusts the input signal and thereby generates the control signal.

11. The amplification apparatus according to claim 10, wherein
the control signal generator generates the control signal, and
a cycle of the control signal is a half cycle of the input signal.

12. A transmission apparatus comprising:
the amplification apparatus according to claim 1 configured to receive a rectangular signal as the input signal and output the combined signal; and
an antenna configured to transmit the combined signal.

13. The transmission apparatus according to claim 12, further comprising
a waveform converter configured to convert a waveform of an input signal into a rectangular wave and thereby to generate the rectangular signal.

14. The transmission apparatus according to claim 12, further comprising
a filter configured to remove a predetermined frequency component included in the combined signal.

15. An amplification apparatus comprising:
a switching amplifier configured to be driven on the basis of a control signal and amplify an input signal to be amplified to generate an amplified signal; and
an adjuster configured to adjust the control signal before the control signal is input into the switching amplifier, wherein
the adjuster adjusts at least one of a pulse width of the control signal or a delay time of the control signal with respect to the input signal,
the switching amplifier includes a full bridge circuit that is driven on the basis of the input signal and the control signal,
the full bridge circuit includes:
a first high-side transistor;
a second high-side transistor connected in parallel e first high-side transistor;
a first low-side transistor connected in series with the first high-side transistor;
a second low-side transistor connected in series with the second high-side transistor and in parallel with the first low-side transistor; and
a transformer whose one end is connected to a connection point between the first high-side transistor and the first low-side transistor, and whose the other end is connected to a connection point between the second high-side transistor and the second low-side transistor, and
the first low-side transistor and the second low-side transistor switch on the basis of the control signal.

16. The amplification apparatus according to claim 15, wherein
the adjuster adjusts the control signal to have a pulse width or a delay time corresponding to a frequency of the input signal.

17. The amplification apparatus according to claim 15, wherein
a power level of harmonics of the amplified signal is lower than that of a signal generated by the switching amplifier on the basis of control signal unadjusted by the adjuster.

18. The amplification apparatus according to claim 15, wherein
a plurality of the switching amplifiers are provided,
the amplification apparatus further comprising a combiner configured to combine amplified signals from the respective switching amplifiers to generate a combined signal.

19. The amplification apparatus according to claim 15, further comprising one or more AND circuits, wherein
the adjuster adjusts the input signal, and
the AND circuits generate signals for the switching amplifiers corresponding to the AND circuits on the basis of the adjusted input signal and signals that determine driving of the switching amplifiers.

20. A transmission apparatus comprising:
the amplification apparatus according to claim 15 configured to receive a rectangular signal as the input signal and output the combined signal; and
an antenna configured to transmit the combined signal.

* * * * *